United States Patent

Crouch et al.

[11] Patent Number: 5,995,731
[45] Date of Patent: *Nov. 30, 1999

[54] MULTIPLE BIST CONTROLLERS FOR TESTING MULTIPLE EMBEDDED MEMORY ARRAYS

[75] Inventors: Alfred Larry Crouch; Jennifer Lynn McKeown; Clark Gilson Shepard, all of Travis, Tex.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/998,564

[22] Filed: Dec. 29, 1997

[51] Int. Cl.$^6$ ..................................................... G06F 11/27
[52] U.S. Cl. ..................................... 395/500.05; 714/718
[58] Field of Search ............................... 365/189.02, 200, 365/205, 220, 230.01, 230.03, 201; 364/578; 371/21.1, 22.2, 22.5, 22.6, 25.1; 395/183.06, 183.18, 182.02

[56] References Cited

U.S. PATENT DOCUMENTS

| | | | |
|---|---|---|---|
| 4,686,456 | 8/1987 | Furuyama | 324/73 R |
| 5,202,888 | 4/1993 | Ochiai | 371/21.3 |
| 5,383,195 | 1/1995 | Spence et al. | 371/23.5 |
| 5,388,104 | 2/1995 | Shirotori et al. | 371/21.1 |
| 5,528,553 | 6/1996 | Saxena | 365/230.01 |
| 5,535,164 | 7/1996 | Adams et al. | 365/201 |
| 5,574,692 | 11/1996 | Dierke | 365/201 |
| 5,617,531 | 4/1997 | Crouch et al. | 395/183.06 |
| 5,640,509 | 6/1997 | Balmer et al. | 395/183.18 |
| 5,675,545 | 10/1997 | Madhaven et al. | 365/201 |
| 5,734,615 | 3/1998 | Dierke | 365/201 |
| 5,818,772 | 10/1998 | Kung | 365/201 |

OTHER PUBLICATIONS

Luige Ternullo, Jr., et al., 'Deterministic Self–Test of a High–Speed embedded Memory and Logic Processor Subsystem', 1995 IEEE International Test Conference, pp. 33–44.

Ian Burgess, et al., 'Practical design techniques for memory BIST', Electronic Design, vol. 45, p. 106, May 12, 1997,

*Primary Examiner*—Kevin J Teska
*Assistant Examiner*—Lonnie A. Knox
*Attorney, Agent, or Firm*—Bruce Hayden; Jeffrey G. Toler

[57] ABSTRACT

Multiple memory arrays (215, 225) in embedded applications are each tightly coupled to their own Built-In Self-Test (BIST) controller to form BISTed memory cells (210, 220) supporting structural and retention testing. Testing on multiple BISTed memories (210, 220) is initiated by common INVOKE (230), RETENTION (240), and RELEASE (250) signals. DONE and HOLD signals are combined (260, 280) from the multiple BISTed memories (210, 220) and delayed to generate a global "all memory" DONE (265) and HOLD (285) signals. FAIL signals are combined (270) from the multiple BISTed memories (210, 220) to generate a global "any memory" FAIL (275) signal. The BISTed memories can be combined in multiple stages to meet power limitations.

45 Claims, 2 Drawing Sheets

MULTIPLE BIST CONTROLLERS FOR TESTING MULTIPLE EMBEDDED MEMORY ARRAYS

FIELD OF THE INVENTION

The present invention generally relates to semiconductor devices, and more specifically to testing multiple embedded memories.

BACKGROUND OF THE INVENTION

Modern integrated circuits are integrating or embedding more and more memory on an integrated circuit die to meet functional and performance goals. The integration of large amounts of embedded memory is not limited to only complete and fabricated semiconductor devices. Design units known as embedded cores are also being provided with embedded memory, which are design descriptions that may be delivered as a behavioral, register transfer, or gate-level model, or may be delivered as a physical layout description. Any on-core memory becomes on-chip memory when the core is integrated into a complete semiconductor device.

In current art designs, embedded memory is generally placed along one side of the chip, or in one physical area. The embedded memory is then tested by one of several methods. One method of testing can be done by creating a test architecture that brings the data, address, and memory control lines (read/write, output enable, etc.) out to the chip interface during a memory test mode. This allows the tester to apply memory test algorithms directly to the memory as if the chip were a discrete memory chip. Another method of testing that can be used is an internal embedded Memory Built-In Self-Test (MBIST or memory BIST). In this case a single memory BIST controller creates the test stimulus and the test sequencing for all of the embedded memory arrays (the memory testing algorithms are embedded within the chip).

As process geometries (integrated circuit feature sizes) shrink, there is more opportunity and need to embed ever greater quantities of memory on single integrated circuit die. Another integration trend is the separation and distribution of memory arrays across a die, placing them near the functional units that they are associated with. One reason for this trend is the delivery of portions of the integrated circuit as core descriptions with separate embedded memories, with the embedded memory physically located with the delivered core unit. Another reason for this trend is that interconnect delay times are rapidly overcoming gate delay times.

However, the shrinking feature geometries and the large number of physically distributed memory arrays also creates even more test problems. For example, a direct access memory test architecture within a chip with a large number of distributed embedded memory arrays (e.g., 30 or more), and with memory arrays that have wide data paths (e.g., 32 or 64 bits), require a large amount of routing resources to allow the tester to have direct access to each of the memory arrays. This is compounded by the problem that in process geometries in the deep submicron range (below 0.5 micron), designs are more likely to be route limited, and routing becomes the greatest component in propagation timing delay. This architecture also requires a large number of borrowed functional pins to create the tester access pin interface, including the memory control interface which may include a "which memory to test" interface. Even though this architecture may be silicon and package costly in internal routes and borrowed package ins, it is "cost of tester memory" efficient since some automatic test equipment (ATE) can provide built-in algorithms to conduct memory test (very little tester memory is used for the storage of test program information). One of the negative trade-offs, in this case, is the lengthy test time required to test the memory arrays one at a time.

A similar set of trade-offs can be applied to a memory BIST architecture. In this case, the memory test sequencer, stimulus generator, and comparator logic are all embedded within a single chip. Access to all of the individual memory arrays is provided. This test architecture is still route intensive, but one main advantage is now that the MBIST functionality requires a much smaller package pin interface, consisting of (at a minimum): "invoke", "done", and "fail" signals, instead of having to supply the data bus, address bus, and read/write control signals as is required by a direct access test architecture. This is particularly advantageous for core design descriptions since in these architectures, a memory embedded within a core becomes "doubly embedded" when the core is embedded within a chip. The tester "cost of tester memory" is reasonably low in this type of testing, since MBIST can be run by having a tester subroutine that just "clocks" the chip until a "done" signal is asserted.

One of the key cost items to testing memories is a retention test. This test starts by loading sequential logic with a particular set of logic values (referred to as "DATA"), stopping the clock for a period of time, and then verifying the ability of the sequential logic to retain the first set of logic values. A second set of logic values, that are generally the complement of the first set ("DATABAR"), is then applied to the sequential logic, the clock is again stopped and re-started, and the sequential logic is verified again. This is a time costly test in relation to the length of the whole test program because of the two lengthy retention clock pauses described above.

The use of MBIST is more than just a methodology change for the memory test. It impacts the overall testing sequence for integrated circuits that involves scan testing, memory testing, memory retention testing, general sequential logic retention testing, and Iddq testing. For example, a prior art method of testing using a direct memory test access architecture generally conducts scan testing and memory testing as separate operations, but conducts a single chip-wide set of retention tests for scan and memory logic. Each memory array is loaded, that memory frozen, test mode changed, a scan state loaded, and then the pauses conducted. A test sequence like this typically breaks down into the following test program timetable (Table T-1):

TABLE T-1

| Test Types | Test Times |
| --- | --- |
| Scan Tests | 100ms |
| Memory Tests (for at least 2 memories) | 200ms per memory |
| Scan Retention + Memory Retention | 200ms per memory |
| Iddq | 100ms |
| Total | 1400ms+400ms/mem |

A similar table (Table T-2) can be constructed for a single chip-level memory BIST controller. In this case, the scan tests and the memory tests are still done separately. Due to architectural limitations of applying an internal memory BIST controller made of system sequential elements, the scan and memory BIST cannot be operated simultaneously since the scan mode would disrupt the BIST controller. This means that the retention testing must now be done separately for scan logic and for memory logic. A single memory BIST controller can be designed to apply the memory test to all memory arrays simultaneously, so there is an overall test time saving in that all memory arrays can be tested simultaneously, and all memory arrays can be retention tested simultaneously.

TABLE T-2

| Test Types | Test Times |
|---|---|
| Scan Tests | 100ms |
| Memory Tests (for at least 2 memories) | 200ms all memory |
| Scan Retention (4 pauses @ 50ms each) | 200ms |
| Memory Retention | 200ms all memories |
| Iddq | 100ms |
| DC Parametrics | 400ms |
| Total | 1200ms |

From this point of view, the memory BIST method can be shown to be more effective than the direct access test method in test time. However, if the number of memory arrays included in the overall chip are large and they are widely distributed, then the negative trade-offs of routing, and potentially power consumption (testing all memory arrays simultaneously with an aggressive test algorithm may exceed the power rating of the chip or the package) may make manufactuability a risky prospect.

SUMMARY OF THE INVENTION

The present invention generally relates to various models representing at least a portion of a semiconductor device and various semiconductor devices. In accordance with a particular embodiment, the model includes a plurality of memory arrays; and a plurality of test circuit controllers, wherein test data is concurrently read from at least one element within each of the plurality of memory arrays during a retention test controlled by the plurality of test circuit controllers.

In accordance with another embodiment, the model includes a plurality of memory arrays; and a plurality of test circuit controllers, wherein test data is concurrently read from at least one element within each of the plurality of memory arrays during a test controlled by the plurality of test circuit controllers, a first memory array of the plurality of memory arrays associated with a first of the plurality of test circuit controllers to control testing of the first memory array and a second memory array of the plurality of memory arrays associated with a second of the plurality of test circuit controllers to control testing of the second memory array independently of the first memory array.

In accordance with a further embodiment, the semiconductor device includes a plurality of memory arrays; and a plurality of test circuit controllers configured to test the plurality of memory arrays, wherein test data is retrieved from the plurality of memory arrays concurrently during a retention test in response to at least one phase of a test sequence controlled by the plurality of test circuit controllers.

In accordance with another embodiment, the semiconductor device includes a plurality of memory arrays; and a plurality of test circuit controllers configured to test the plurality of memory arrays, wherein test data is retrieved form the plurality of memory arrays concurrently in response to at least one phase of a test sequence controlled by the plurality of test circuit controllers. A first memory array of the plurality of memory arrays is associated with a first of the plurality of test circuit controllers to control testing of the first memory array, and a second memory array of the plurality of memory arrays is associated with a second of the plurality of test circuit controllers to control testing of the second memory array independently of the first memory array.

In accordance with a further embodiment, the semiconductor device includes a plurality of memory arrays; and a plurality of test circuit controllers configured to test the plurality of memory arrays. Test data from the plurality of test circuit controllers is retrievable form the plurality of memory arrays concurrently in response to at least one phase of a test sequence controlled by the plurality of test circuit controllers.

BRIEF DESCRIPTION OF THE DRAWINGS

The features and advantages of the present invention will be more clearly understood from the following detailed description taken in conjunction with the accompanying FIGURES where like numerals refer to like and corresponding parts and in which.

DETAILED DESCRIPTION

The invention taught herein teaches the architecture and method used to apply memory BIST testing of many distributed memory arrays with minimal route impact, power management, and a minimized retention time testing. The solution is primarily based on solving the routing problem by creating an independent memory BIST controller for each distributed memory array (in deep submicron design, routing is the large delay and area penalty, not logic gate area). However, this solution alone creates a further problem of conducting an economical retention test and managing power consumption since each memory array can operate independently during BIST testing and, if the memories are of different sizes (data width and address space), or in different frequency domains, there may not be a single point in time that a retention pause can be applied by an external tester to the memories since the different memory arrays may not simultaneously have the correct "data" state. One potential problem with BIST testing all the memory arrays simultaneously is that a worst case operation (such as a read) for each memory array may occur simultaneously. This may exceed the integrated circuit or package power rating.

A test time table (Table T-3) for a distributed MBIST type of test architecture without power management or retention time optimization might be:

TABLE T-3

| Test Types | Test Times |
|---|---|
| Scan Tests | 100s |
| Memory Tests (for at least 2 memories) | 200ms all memory |

TABLE T-3-continued

| Test Types | Test Times |
| --- | --- |
| Scan Retention (4 pauses @ 50ms each) | 200ms |
| Memory Retention | 200ms per memories |
| Iddg | 100ms |
| DC Parametrics | 400ms |
| Total | 1400ms+200ms/mem |

As the above table shows, the more memory arrays that there are on a single integrated circuit die, the more the test program time grows. As can be seen in the table, the reduction in memory test time from simultaneous testing is offset by the increase in retention test time. This problem only gets worse as more memories, or larger memories, are added (i.e. the overall retention time gets progressively larger).

Test time is reduced further, and it is reduced independently of how many memory arrays are supported or included in the chip by providing a method by which the independent memory BIST units can synchronize the "DATA" and "DATABAR" states in time so that a single retention pause may be accomplished per data state, with the retention test being a function of the largest single test (i.e., usually memory BIST on the largest memory).

Figure 1:
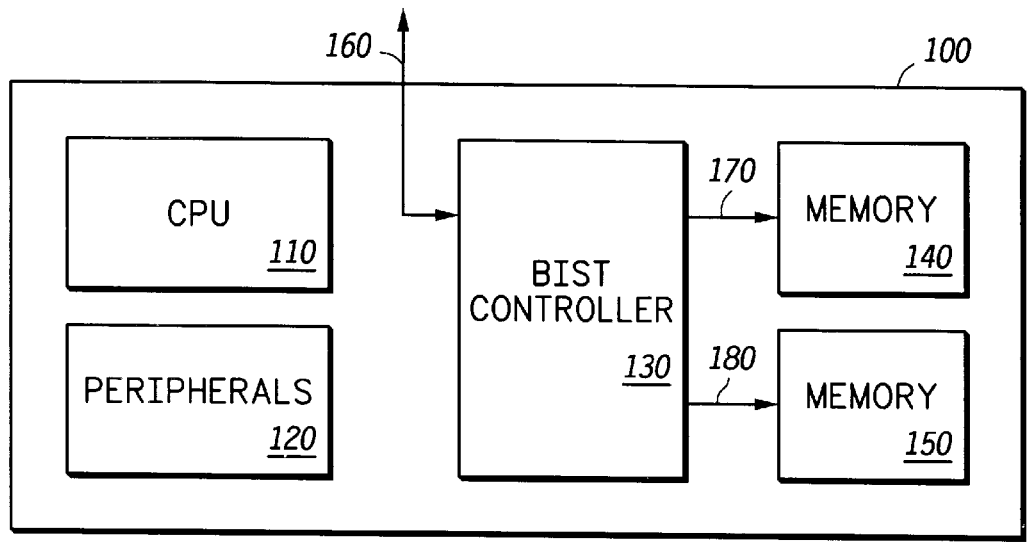
FIG. 1 is a block diagram that illustrates a prior art architecture utilizing a single memory BIST controller to control multiple memories.

FIG. 1 is a block diagram that illustrates a prior art architecture utilizing a single memory BIST controller to control multiple memories. A single integrated circuit die 100 contains a central processing unit (CPU) 110, peripherals 120, a plurality of memory arrays 140, 150, and a memory BIST controller 130. The memory BIST controller 130 controls BIST memory testing of the plurality of memory arrays 140, 150. The memory BIST controller is controlled by a plurality of signals 160, that include an "INVOKE" input signal, and "DONE", and "FAIL" output signals. The "INVOKE" signal initiates memory BIST testing, and the memory BIST controller 130 either responds with a "DONE" signal indicating success, or a "FAIL" signal indicating failure. The memory BIST controller 130 communicates with the plurality of memory arrays 140, 150 on a corresponding plurality of BIST busses 170, 180. These BIST busses 170, 180 generally include a data bus, an address bus, and control signals. One significant problem with this architecture is that the implementation of these BIST busses 170, 180 requires significant amounts of routing resources. As noted above, as features shrink into the deep submicron range, routing becomes a critical design and manufacturability concern.

Figure 2:
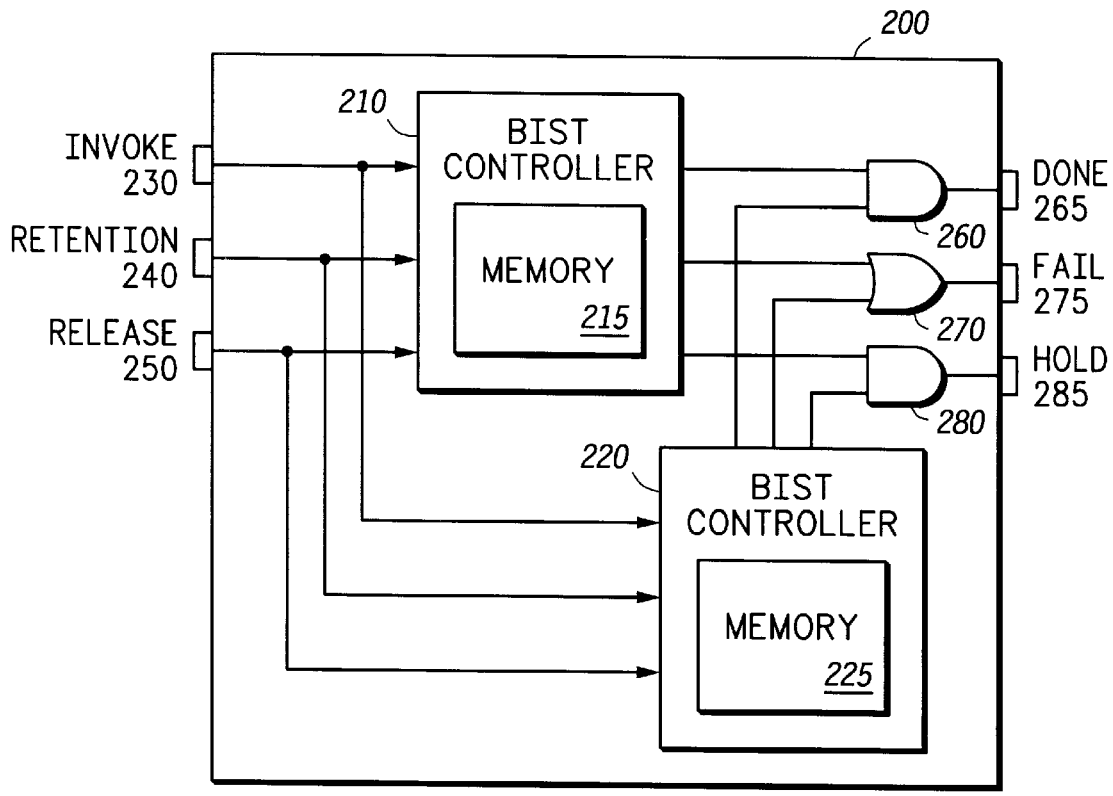
FIGS. 2 and 4 are block diagrams that illustrate an integrated circuit architecture with multiple memory BIST controllers to control memory testing of a corresponding plurality of memory arrays, in accordance with the present invention.

FIG. 2 is a block diagram that illustrates an integrated circuit architecture with multiple memory BIST controllers to control memory testing of a corresponding plurality of memory arrays. An integrated circuit 200 contains two memories 215, 225 with an associated BIST controller per memory. These BIST controllers with associated memories 215, 225 will hereafter be termed "BISTed" memories 210, 220. The two BISTed memories 210, 220 each receive an "INVOKE" 230, "RETENTION" 240, and "RELEASE" 250 signals, typically generated by either an external tester or by an internal test control unit (TCU). Each BISTed memory 210, 220 generates a "DONE" 265, a "FAIL" 275, and a "HOLD" 285 signal. The DONE 265 signals from each of the BISTed memories 210, 220 are combined with an AND gate 260 in order to generate a combined DONE 265 signal for the entire integrated circuit 200. The FAIL 275 signals from each of the BISTed memories 210, 220 are combined with an OR gate 270 in order to generate a combined FAIL 275 signal for the entire integrated circuit 200. The HOLD 285 signals from each of the BISTed memories 210, 220 are combined with an AND gate 280 in order to generate a combined HOLD 285 signal for the entire integrated circuit 200.

The INVOKE 230 signal starts memory BIST testing for each of the BISTed memories 210, 220. Two modes are supported: a structural memory test, and a memory retention test. The structural memory test tests manufacturing correctness of the memory arrays 215, 225. There are numerous well-established algorithms for structural memory testing, such as March C+, Galloping Ones, Walking Ones, and Ping Pong. Retention testing loads known values in memory, pauses a particular period of time, and then verifies that the known values are still where they belong in memory. Retention testing identifies bridges, capacitive leakage, and other similar faults. Either type of testing is initiated by asserting the INVOKE 230 signal. When the INVOKE 230 signal is asserted, Retention testing is initiated if the RETENTION 240 signal is also asserted. Otherwise, structural memory testing is initiated. In the case of structural memory testing (with RETENTION 240 negated), each BIST controller will generate either a DONE 265 or FAIL 275 signal upon completing, indicating whether or not the corresponding BIST test succeeded for failed. Note that in a preferred embodiment, the DONE 265 signal is always asserted at the end of testing, regardless of the state of the FAIL 275 signal. In another embodiment, failure may be detected by an absence of the DONE 265 signal after a suitable wait by the external tester, without the necessity of a FAIL 275 signal. The AND gate 260 delays the global DONE 265 signal until all connected BIST controllers are done. Likewise, the OR gate 275 operates to generate a failure indication on the global FAIL 275 signal if at least one BIST controller detects failure.

Retention testing is initiated when the INVOKE 230 signal is asserted while the RETENTION 240 signal is asserted. Each BIST controller initializes its corresponding memory array 215, 225 as required. Then, when a BIST controller is done initializing its corresponding memory array 215, 225, it pauses, and asserts a HOLD 285 signal. The second AND gate 280 operates to delay the global HOLD 285 signal until all of the BIST controllers are paused and are each generating a local HOLD signal. This can be used to allow a tester to start its retention timer. After a predetermined retention pause time has elapsed, the RELEASE 250 signal is then asserted, allowing the BIST controllers to test and invert the data in the memory arrays 215, 225, and again generate a local HOLD signal when this phase is complete. As before, the global HOLD 285 signal is delayed by the second AND gate 280 until all BISTed memories 210, 220 are asserting their local HOLD signals. Other test phases may be similarly initiated, if required, with a RELEASE 250 signal initiating a test phase, and the HOLD 285 signal indicating completion.

This architecture provides a simple mechanism for BIST testing multiple memories at the same time, while minimizing routing and external pin counts. Instead of the large number of signals required by the BIST busses 170, 180 shown in FIG. 1, each BISTed memory 210, 220 requires a minimal number of routed signals. Another advantage of this architecture is modularization. In FIG. 2, the boundary 200 may represent a core instead of an entire integrated circuit die. Many such core devices can be integrated in a single integrated circuit die. Indeed, more than two levels of modularization are possible.

Figure 3:
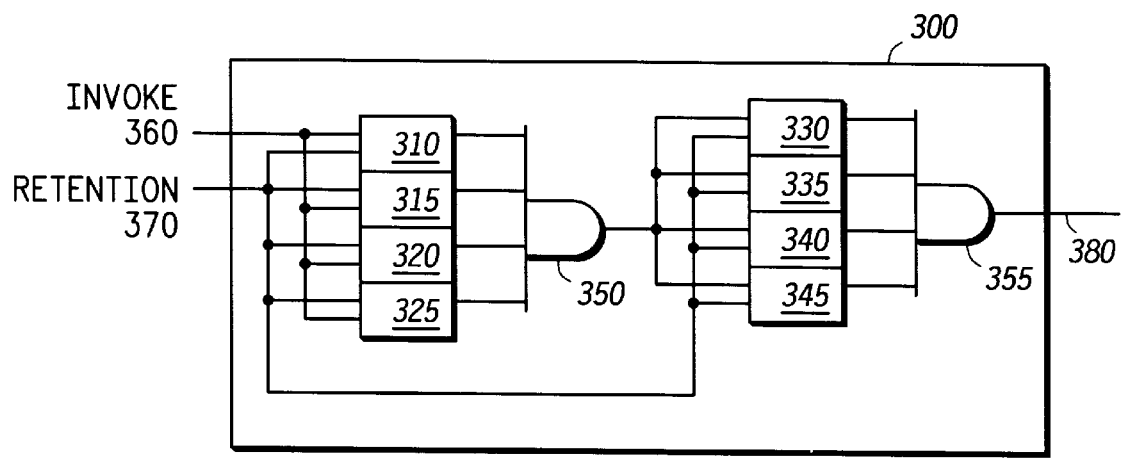
FIG. 3 is a block diagrams of an integrated circuit containing multiple levels of BISTed memories, in accordance with the present invention.

FIG. 3 is a block diagram of an integrated circuit 300 that contains multiple levels of BISTed memories. A first set of BISTed memories 310, 315, 320, 325 is initiated by a shared INVOKE 360 signal. In the case of structural testing (i.e. with the RETENTION 370 signal negated), the DONE signals from each of these BISTed memories 310, 315, 320, 325 are combined and delayed by a first AND gate 350. The first AND gate 350 generates an INVOKE signal for a second set of BISTed memories 330, 335, 340, 345. Thus, the second set of BISTed memories 330, 335, 340, 345 are structurally tested after all of the first set of BISTed memories 310, 315, 320, 325 are done testing and have asserted their respective DONE signals. The DONE signals for each of the second set of BISTed memories 330, 335, 340, 345 are combined and delayed by a second AND gate 355. A global DONE signal 380 is asserted when all of the second set of BISTed memories 330, 335, 340, 345 are done testing and have asserted their respective DONE signals.

Operation in retention mode testing (i.e. with the RETENTION 370 signal asserted) is similar. The RETENTION 370 signal is asserted to indicate retention testing. The INVOKE 360 signal causes the first set of BISTed memories 310, 315, 320, 325 to initialize their respective memory arrays and then pause when complete. A HOLD signal is then generated by each of the first set of BISTed memories 310, 315, 320, 325 which is delayed and combined by the first AND gate 350. The output of the first AND gate 350 then results in an INVOKE signal being asserted for the second set of BISTed memories 330, 335, 340, 345. The HOLD signals from each of the second set of BISTed memories 330, 335, 340, 345 are combined and delayed by the second AND gate 355, which generates a global HOLD signal 380. Similarly, a global RELEASE signal (not shown) releases each of the first set of BISTed memories 310, 315, 320, 325. The HOLD signals generated by each of the first set of BISTed memories 310, 315, 320, 325 are combined by an AND gate, which in turn generates a RELEASE signal for the second set of BISTed memories 330, 335, 340, 345. The HOLD signals from the second set of BISTed memories 330, 335, 340, 345 are similarly delayed and combined with another AND gate, ultimately generating a global HOLD signal. The FAIL signals for all of the BISTed memories 310, 315, 320, 325, 330, 335, 340, 345 can be combined by a set of (possibly cascaded) OR gates 270, as shown in FIG. 2. Note that two levels or sets of BISTed memories are shown here. It is reasonably straight forward extending this architecture to more than three levels or sets of BISTed memories.

One reason for utilizing such a multiple level BISTed memory architecture is that active memory elements consume power. In normal operation, all of the memory elements in an integrated circuit are rarely, if ever, operational at the same time. This does not apply however during memory testing, since many, if not all of the memory arrays may be active at the same time performing power intensive memory operations.

Power considerations are important when determining the number of memories to test simultaneously. Power brown-outs could occur when too many RAMS are switching at the same time if the chips power resources are not sufficient, or if there are package limitations.

The preliminary RAM power analysis equation can be described basically as, "the sum of the power consumed per worst case operation (i.e., READ), per instance of each memory array, plus the power consumed by the BIST controller, per each clock cycle." In effect, the worst case power consumption can be estimated on the assumption that every memory will conduct a READ every cycle. If the sum total exceeds a predefined percentage (e.g. half) of the package power limitations, then the BIST modules should be staged in a combination parallel-sequential manner.

The power per operation of each RAM depends on the size of the RAM, the physical layout (aspect ratio), and the access time rating of the RAM. These numbers are generally listed as milliwatts per Megahertz.

Each memory layout or configuration has its own "Worst Case Power per Operation" (i.e., two different 512×32 memories would have different power requirements if each have different aspect ratios). The WCPO is typically given for a READ and is summed for each memory running BIST concurrently. Additionally, package limitations, numbers of powers and grounds, and sizes of internal power rails must be understood for estimating the WCP.

If it is necessary to limit the number of BIST operations that could occur simultaneously, then a parallel-sequential staging order for BIST tests can be designed (a stage is considered to be the simultaneous operation of some number of the BIST units, but not all of them) as shown in FIG. 3. Staging memory tests one after the other is accomplished by using the OR'ed DONE signals from the previous stage's BIST tests to generate the INVOKE signals for the next stage's BIST tests. If a "stop on first fail" condition is preferred, then the FAIL for each BIST can be used to gate the next stage's INVOKE and can be presented to the chip output.

The use of multiple distributed BISTed memories leaves one remaining potential manufacturability concern: the ability to diagnose a failure that occurs within one of the embedded memory arrays. The use of independent distributed BISTed memories with only a "DONE" and "FAIL" output, only identifies the failing memory array. Providing a "FAIL" signal that toggles with each fail only provides information on the failing address (i.e., word). More precise diagnosis may still be required in case there are manufacturing defects and process problems that require failure analysis for yield enhancement. Since route resources are a concern, then providing a full sized data path from each memory (e.g., a 32-bit data path from a memory with a 32 bit word or a 128-bit data path from a memory with a 128-bit word width) is not a feasible solution. The preferred embodiment taught in this invention is to provide a reduced size diagnostic data path signal, or signals, from each memory that provides the read data from the memory on some subset of data bits (e.g., bits 0 thru 3 of a 32-bit word, in one time period, and bits 4 thru 7 in another time period, and so on). The MBIST is then applied on the identified failing BISTed memory as often as necessary to provide the complete diagnostic data. The diagnostic BIST test mode is an alternate test mode rather than the manufacturing test mode. The alternate test mode is supported because the act of diagnosing a problem is an engineering verification event, and not a manufacturing verification event, therefore, the manufacturing test mode does not incur the test time penalty of repeatedly operating the memory BIST on the failing memory. It is expected that the failure will be identified during the manufacturing test mode, and that the diagnosis of the failure will occur separately at a later time, and possibly on a different tester.

Figure 4:
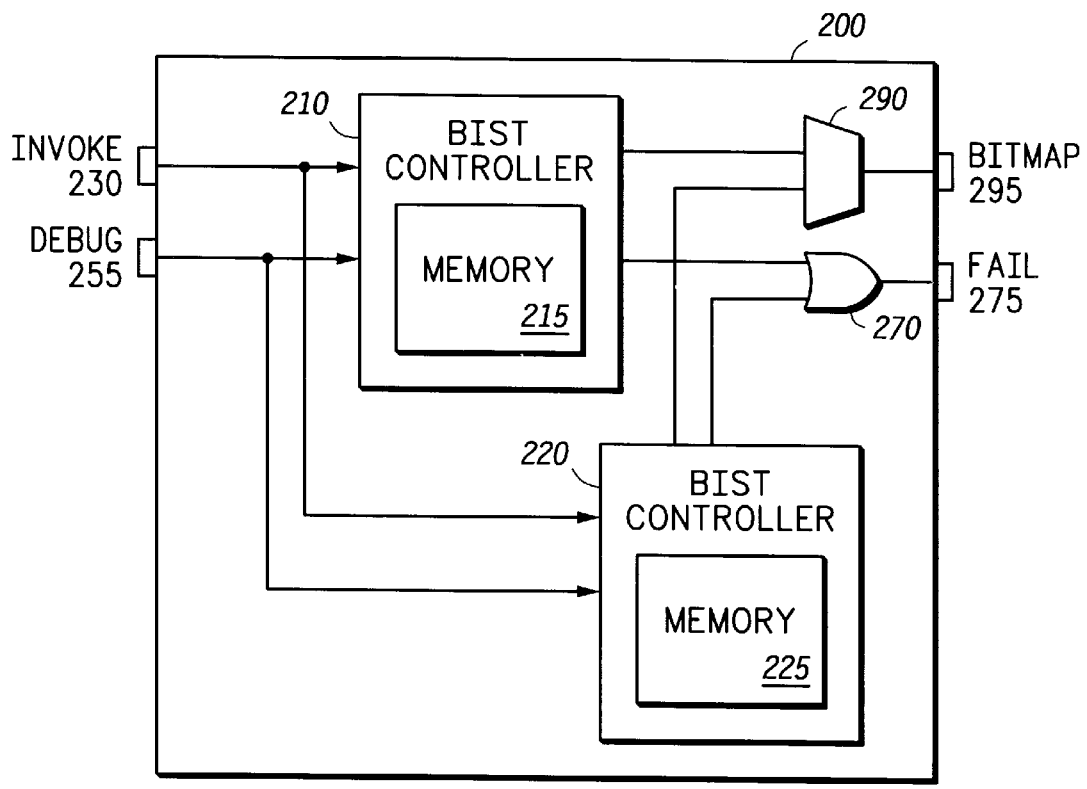

FIG. 4 is a block diagram of an integrated circuit 200 that contains multiple BISTed memories that include a diagnosis mode. The diagnosis mode can be supported by including another input signal to the BISTed memory known as "DEBUG" 255, and another output signal, or signals, known as "BITMAP" 295. The "DEBUG" 255 signal is similar to the "RETENTION" 240 input signal in that it places the BIST controller in the diagnostic test mode when "INVOKE" 230 is asserted if the "DEBUG" signal is also asserted. When "DEBUG" is asserted, the BIST controller will operate through an entire operation of the structural test algorithm, and will output the read data on the "BITMAP" signals. The BIST controller will repeatedly operate until the entire data output map is presented to the tester (e.g., a BISTed memory with a 32-bit word, and a 1 bit "BITMAP" signal, would operate 32 times to provide the read data for each bit element of the memory word). The repeated operation and output of data in real time (when operated at the rated frequency) provides more comprehensive test coverage than methods based on halting the BIST and serially shifting out the complete data word. The halting of the BIST while the shifting out of the complete data word provides an artificial latency during operation that allows some timing related failure modes to escape detection. At the chip or core level, multiple sets of "BITMAP" signals from the different BISTed memories 210, 220 can be combined through a multiplexer 290 function so that an individual failing memory may be diagnosed. A "which memory to test" function, or a direct tester interface can be used to select which "BITMAP" signals to present to the global "BITMAP" 295 signals through multiplexer 290.

Those skilled in the art will recognize that modification and variations can be made without departing from the spirit of the invention. Therefore, it is intended that this invention encompass all such variations and modifications as fall within the scope of the appended claims. For example, the signal names such as "INVOKE" 230, "DONE" 265, "FAIL" 275, "RETENTION" 240, "RELEASE" 250, "HOLD" 285, "DEBUG" 255 and "BITMAP" 295 may be provided with different naming, and may be provided from an internal design unit instead of being sourced from the pin interface and accessed directly from a tester. The signals may also support gating other than that described (e.g., the "INVOKE" 230 signal may have other restrictions placed on it's assertion to prevent the instigation of memory BIST— for example if some other design unit such as the PLL were still operating). The signals at each BISTed memory may also exist in conjunction with other functions and signal— for example, there may exist a "WRITE INHIBIT" signal that prevents the memory array from reacting to random input during the scan mode, or there may exist a direct input "PAUSE" that would be a direct connection from the tester to the individual memory that places the memory and memory BIST into a pause or retention state (i.e., there may exist more than one way to instigate a retention test). The signals such as "INVOKE" 230, "RETENTION" 240, and "RELEASE" 250 may also be separated into multiple signals or combined into fewer signals. For example, the "INVOKE" 230 signal may be comprised of two signals, a "RESET" and an "APPLY", where the "RESET" portion of the signal would deassert the reset state of the BIST controller, and the "APPLY" portion of the signal would configure the memory signals so that their source and destination were now the BIST controller instead of the normal functional circuit. As another example, the "RETENTION" 240 and the "RELEASE" 250 signals can be combined into a single "RETENTION" 240 signal if the BIST controller reacts to an applied pulse instead of a logic level. In another example, the "HOLD" 285 signal can be eliminated if an on-chip counter or an on-tester counter can be used to synchronize the application of the "RELEASE" 250 signal.

It should also be noted, that the retention test described as the preferred embodiment that is based on "DATA" and "DATABAR" should in no way limit the data used or require that "DATABAR" be the complement of "DATA". It should also be noted that a BISTed memory may be comprised of a BIST controller and more than one memory array, but that the compilation is treated as a single unit.

Claim elements and steps herein have been numbered and/or lettered solely as an aid in readability and understanding. As such, the numbering and/or lettering in itself is not intended to and should not be taken to indicate the ordering of elements and/or steps in the claims.

What is claimed is:

1. A model representing at least a portion of a semiconductor device comprising:

a plurality of memory arrays; and a plurality of test circuit controllers, wherein test data is concurrently read from at least one element within each of the plurality of memory arrays during a retention test controlled by the plurality of test circuit controllers.

2. The model of claim 1, wherein:

the at least the portion of the semiconductor device has a first terminal and a second terminal;

the first terminal is coupled to the plurality of test circuit controllers and is used to input a signal to the plurality of test circuit controllers to activate the plurality of test circuit controllers; and the second terminal is coupled to the plurality of test circuit controllers and is used to output a signal to signify that a test for all memory arrays within the plurality of memory arrays has been successfully completed.

3. The model of claim 2, wherein:

the at least the portion of the semiconductor device has a third terminal that is coupled to the plurality of test circuit controllers and is used to output a signal to signify that a failure has occurred during a test.

4. The model of claim 2, wherein:

the at least the portion of the semiconductor device has a third terminal that is coupled to the plurality of test circuit controllers and is used to input a signal to initiate at least one memory test while the plurality of test circuit controllers have been activated by the first terminal.

5. The model of claim 1, wherein:

the test has at least one testing phase of fixed duration where each of the plurality of memory arrays is paused prior to a second testing phase where the test data is read concurrently by each of the plurality of memory arrays.

6. The model of claim 2, wherein all test data for testing the plurality of memory arrays is generated within the plurality of test circuit controllers.

7. The model of claim 2, wherein:

one memory array of the plurality of memory arrays has a block arrangement, wherein the block arrangement is x bits long;

the at least the portion of the semiconductor device has a set of y output terminals that are coupled to the plurality of test circuit controllers, wherein diagnostic data from the one memory array is output over the set of y output terminals; and x and y are integers, and x is greater than y.

8. The model of claim 2, wherein the at least the portion of the semiconductor device is a single core within the semiconductor device.

9. The model of claim 2, wherein the at least the portion of the semiconductor device is an entire semiconductor device.

10. A semiconductor device comprising:

a plurality of memory arrays; and a plurality of test circuit controllers configured to test the plurality of memory arrays, wherein test data is retrieved from the plurality of memory arrays concurrently during a retention test in response to at least one phase of a test sequence controlled by the plurality of test circuit controllers.

11. The semiconductor device of claim 10, wherein the semiconductor device has a memory array to test circuit controller ratio of 1:1.

12. The semiconductor device of claim 10, wherein:

the semiconductor device has a first terminal and a second terminal;

the first terminal is coupled to the plurality of test circuit controllers and is capable of inputting a signal to the plurality of test circuit controllers to activate the plurality of test circuit controllers; and the second terminal is coupled to the plurality of test circuit controllers and is capable of outputting a signal to signify a test for all memory arrays within the plurality of memory arrays has been successfully completed.

13. The semiconductor device of claim 12, wherein:

the semiconductor device has a third terminal that is coupled to the plurality of test circuit controllers and is capable of outputting a signal to signify that a failure has occurred during a test.

14. The semiconductor device of claim 12, wherein:

the semiconductor device has a third terminal that is coupled to the plurality of test circuit controllers and is capable of inputting a signal to initiate at least one memory test while the plurality of test circuit controllers have been activated by the first terminal.

15. The semiconductor device of claim 12, wherein:

the semiconductor device has a third terminal and a fourth terminal;

the third terminal is coupled to the plurality of test circuit controllers and is capable of outputting a signal to signify an end of a time period after data has been written into the plurality of memory arrays, wherein during a specific test, the time period starts at a point in time selected from a group consisting of:

about a first time that a first datum is first written into any memory array within the plurality of memory arrays, and about a second time that a last datum is written into the plurality of memory arrays; and the fourth terminal is coupled to the plurality of test circuit controllers and is capable of inputting a signal to signify that the time period has elapsed and a next step in the specific test is to begin.

16. The semiconductor device of claim 10, wherein:

the test data is generated by the plurality of test circuit controllers.

17. The semiconductor device of claim 12, wherein:

one memory array of the plurality of memory arrays has a block arrangement, wherein the block arrangement is x bits long;

the semiconductor device has a set of y output terminals that are coupled to the plurality of test circuit controllers, wherein diagnostic data from the one memory array is capable of being output over the set of y output terminals; and x and y are integers, and x is greater than y.

18. The semiconductor device of claim 12, wherein:

the plurality of memory arrays and the plurality of test circuit controllers lies within a single core of the semiconductor device.

19. A method of testing a semiconductor device comprising: providing the semiconductor device having:

a plurality of memory arrays, a plurality of test circuit controllers, and a first power dissipation rate, wherein performing an operation using all memory arrays of the plurality of memory arrays would exceed the first power dissipation rate;

testing a first portion of the plurality of memory arrays using a first portion of the plurality of test circuits at a second power dissipation rate that is less than the first power dissipation rate; and testing a second portion of the plurality of memory arrays using a second portion of the plurality of test circuits at a third power dissipation rate that is less than the first power dissipation rate.

20. The semiconductor device of claim 10, wherein:

the test includes at least one testing phase of fixed duration where each of the plurality of memory arrays is paused prior to a second testing phase where the test data is read concurrently by each of the plurality of memory arrays.

21. The method of claim 19, wherein the step of testing a first portion of the plurality of memory arrays includes conducting a retention test for the first portion of the plurality of memory arrays.

22. The method of claim 21, wherein: the retention test includes at least one testing phase of fixed duration where each of the plurality of memory arrays is paused prior to a second testing phase where test data is read concurrently by each of the plurality of memory arrays.

23. The method of claim 19, wherein, the semiconductor device has a memory array to test circuit controller ratio of 1:1 wherein the step of testing a first portion of the plurality of memory arrays includes conducting a structural memory test for the first portion of the plurality of memory arrays.

24. The method of claim 19, wherein:

the step of testing the second portion begins after the step of testing the first portion.

25. A method of designing a first model of at least a portion of a semiconductor device comprising:

generating the first model of the at least the portion of the semiconductor device, wherein:

the first model includes a second model that includes a first memory array and a first test circuit controller, the first model includes a third model that includes a second memory array and a second test circuit controller, and the first model is characterized by a first power dissipation rate, wherein performing an operation using the second and third models would exceed the first power dissipation rate;

testing the second model including a step of testing the first memory array using the first test circuit controller at a second power dissipation rate that is less than the first power dissipation rate; and testing the third model including a step of testing the second memory array using the second test circuit controller at a third power dissipation rate that is less than the first power dissipation rate.

26. The method of claim 25, wherein the step of testing the second model includes conducting a retention test for the first memory array.

27. The method of claim 26, wherein the step of testing the third model includes conducting a retention test for the second memory array.

28. The method of claim 25, wherein:
the semiconductor device has a memory array to test circuit controller ratio of 1:1.

29. The method of claim 25, wherein:
the step of testing the second memory array begins after the step of testing the first memory array.

30. The method of claim 25, wherein:
the at least the portion of the semiconductor device is a single core within the semiconductor device.

31. The method of claim 25, wherein:
the at least the portion of the semiconductor device is an entire semiconductor device.

32. A method of testing a semiconductor device comprising the steps of:
providing a semiconductor device having a first memory array, a second memory array, a first test circuit controller, and a second test circuit controller; and
performing a memory test for the first and second memory arrays including the steps of:
writing data to the first memory array using the first test circuit controller,
writing data to the second memory array using the second test circuit controller,
pausing for a fixed time period after completing the steps of writing data to the first and second memory array;
reading data from the first memory array using the first test circuit controller, and
reading data from the second memory array using the second test circuit controller.

33. The method of claim 32, wherein:
data is read from the first memory array and the second array concurrently.

34. The method of claim 32, wherein the step of pausing is performed using a counter.

35. The method of claim 34, wherein:
the counter is part of a test control unit that is coupled to the semiconductor device.

36. The method of claim 34, wherein:
the counter is part of the semiconductor device.

37. The method of claim 32, wherein:
the semiconductor device further includes a third memory array and a third test circuit controller;
the method further comprises steps of:

writing data to the third memory array using the third test circuit controller, and
reading data from the third memory array using the third test circuit controller;
at least portions of the steps of reading data from the first memory array and reading data from the third memory array are performed simultaneously; and
the step of reading data from the second memory array begins after a prior reading step has been terminated, wherein the prior reading step is selected from a group consisting of reading data from the first memory array and reading data from the third memory array.

38. The method of claim 37, wherein:
the semiconductor device has a power limitation that would be exceeded if the steps of reading data from the first memory array, the second memory array, and the third memory array was performed simultaneously.

39. The method of claim 38, wherein:
the semiconductor device has a plurality of memory arrays that includes the first, second, and third memory arrays; and
the method further comprising selecting a maximum number of memory arrays from which data is to be read simultaneously without exceeding the power limitation.

40. The method of claim 38, wherein:
the semiconductor device has a plurality of memory arrays that includes the first memory array, the second memory array, and the third memory array; and
the method further comprising dividing the plurality of memory arrays into a plurality of sets of memory arrays, wherein:
each of the sets of memory arrays including one or more memory arrays from which data is to be read simultaneously, and
this step is performed by an apparatus selected from a group consisting of the semiconductor device and a test control system that is electrically coupled to the semiconductor device.

41. The method of claim 40, wherein:
the plurality of memory arrays are divided into the plurality of sets based on a memory size for each of the one or more memory arrays in each of the plurality of sets.

42. The method of claim 32, further comprising:
outputting diagnostic data over a plurality of y output terminals, wherein:
the first memory array has a block arrangement, wherein the block arrangement is x bits long;
the diagnostic data from the first memory array is output over the set of y output terminals; and
x and y are integers, and x is greater than y.

43. A model representing at least a portion of a semiconductor device comprising:
a plurality of memory arrays; and
a plurality of test circuit controllers, wherein test data is concurrently read from at least one element within each of the plurality of memory arrays during a test controlled by the plurality of test circuit controllers, a first memory array of the plurality of memory arrays associated with a first of the plurality of test circuit controllers to control testing of the first memory array and a second memory array of the plurality of memory arrays associated with a second of the plurality of test circuit controllers to control testing of the second memory array independently of the first memory array.

44. A semiconductor device comprising:

a plurality of memory arrays; and a plurality of test circuit controllers configured to test the plurality of memory arrays, wherein test data is retrieved from the plurality of memory arrays concurrently in response to at least one phase of a test sequence controlled by the plurality of test circuit controllers;

a first memory array of the plurality of memory arrays associated with a first of the plurality of test circuit controllers to control testing of the first memory array and a second memory array of the plurality of memory arrays associated with a second of the plurality of test circuit controllers to control testing of the second memory array independently of the first memory array.

45. A semiconductor device comprising:

a plurality of memory arrays; and a plurality of test circuit controllers configured to test the plurality of memory arrays, wherein test data from the plurality of test circuit controllers is retrievable from the plurality of memory arrays concurrently in response to at least one phase of a test sequence controlled by the plurality of test circuit controllers.

* * * * *